(12) United States Patent
Choo et al.

(10) Patent No.: US 9,396,979 B2
(45) Date of Patent: Jul. 19, 2016

(54) WAFER CARRIER INCLUDING AIR FILTERS

(71) Applicant: Samsung Electronics Co., Ltd., Suwon-si (KR)

(72) Inventors: Yeon-sik Choo, Hwaseong-si (KR); Soo-Jae Park, Seongnam-si (JP); Jae-Heon Noh, Hwaseong-si (KR); Yong-Sang Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/635,147

(22) Filed: Mar. 2, 2015

(65) Prior Publication Data

US 2016/0049320 A1    Feb. 18, 2016

(30) Foreign Application Priority Data

Aug. 18, 2014   (KR) .................. 10-2014-0106985

(51) Int. Cl.
*H01L 21/673*    (2006.01)

(52) U.S. Cl.
CPC .............................. *H01L 21/67393* (2013.01)

(58) Field of Classification Search
CPC ................................ H01L 21/6734–21/67396
USPC .......................................... 206/454, 710, 711
See application file for complete search history.

(56) References Cited

U.S. PATENT DOCUMENTS

| | | | |
|---|---|---|---|
| 4,666,479 A * | 5/1987 | Shoji ................. | H01L 21/67366 206/454 |
| 4,770,680 A | 9/1988 | Machida et al. | |
| 5,873,468 A * | 2/1999 | Ejima ............... | H01L 21/67393 206/454 |
| 5,896,674 A | 4/1999 | Kim et al. | |
| 5,934,991 A | 8/1999 | Rush | |
| 6,009,890 A | 1/2000 | Kaneko et al. | |
| 6,105,782 A * | 8/2000 | Fujimori .......... | H01L 21/67373 206/710 |
| 6,446,806 B1 * | 9/2002 | Ohori ................ | H01L 21/67373 206/454 |
| 6,547,953 B2 | 4/2003 | Suzuki et al. | |
| 6,558,962 B2 | 5/2003 | Nishiki | |
| 6,829,130 B2 | 12/2004 | Tanaka et al. | |
| 7,316,325 B2 | 1/2008 | Burns et al. | |
| 7,362,113 B2 | 4/2008 | Wood et al. | |
| 7,789,240 B2 | 9/2010 | Yamagishi et al. | |
| 7,823,730 B2 * | 11/2010 | Mimura ............ | H01L 21/67369 206/454 |
| 7,866,480 B2 | 1/2011 | Burns et al. | |
| 7,938,269 B2 * | 5/2011 | Liu .................... | H01L 21/67393 206/454 |
| 8,247,808 B2 | 8/2012 | Choi et al. | |
| 9,022,216 B2 * | 5/2015 | Ku .................... | H01L 21/67359 206/454 |
| 2009/0152162 A1 * | 6/2009 | Tian .................. | H01L 21/67373 206/710 |

FOREIGN PATENT DOCUMENTS

| | | |
|---|---|---|
| KR | 100406337 | 4/2004 |
| KR | 2011032672 | 3/2011 |
| KR | 101368706 | 2/2014 |

* cited by examiner

*Primary Examiner* — Bryon Gehman
(74) *Attorney, Agent, or Firm* — Onello & Mello, LLP

(57) ABSTRACT

A wafer carrier comprises a body part constructed and arranged to accommodate a wafer and including first and second layers which are stacked in sequence. A cover is mountable to the body part. A first air filter is positioned on the cover. A second air filter is positioned on a side of the body part. The second layer is positioned between the first layer and an inner region of the body part. A surface of the second layer facing the inner region is subjected to charge prevention processing.

19 Claims, 11 Drawing Sheets

WAFER CARRIER INCLUDING AIR FILTERS

CROSS-REFERENCE TO RELATED APPLICATION

This application claims priority from Korean Patent Application No. 10-2014-0106985 filed on Aug. 18, 2014 in the Korean Intellectual Property Office, and all the benefits accruing therefrom under 35 U.S.C. 119, the content of which in its entirety are herein incorporated by reference.

TECHNICAL FIELD

The present inventive concepts relate to a wafer carrier.

BACKGROUND

As semiconductor circuits continue to undergo further integration, they are increasingly subject to particle contamination. For example, when CMOS image sensor devices undergo a wafer-level reliability, or environmental, test, there is concern that particle contamination can occur in the wafer carrier chamber. As a result, following the reliability test, such contamination that occurred as a result of the reliability test can influence further evaluations, such as a characterization evaluation.

SUMMARY

The present inventive concepts provide for a wafer carrier that induces exposure by the wafers to defined temperature and humidity while mitigating or eliminating exposure to particles by the wafers contained therein. In this manner, a wafer-level reliability test can be performed to apply temperature and humidity stresses to a wafer.

The technical objects of the present inventive concepts are not limited to the technical objects described herein, and other technical objects, which are not mentioned herein, will be apparent to those skilled in the art from the following description.

In one aspect of the present inventive concepts, there is provided a wafer carrier comprising: a body part constructed and arranged to accommodate a wafer and including first and second layers which are stacked in sequence; a cover mountable to the body part;

a first air filter positioned on the cover; and a second air filter positioned on a side of the body part, wherein the second layer is positioned between the first layer and an inner region of the body part and wherein a surface of the second layer facing the inner region is subjected to charge prevention processing.

In some embodiments, the first layer comprises polyether sulfone (PES) or aluminum (Al).

In some embodiments, the second layer comprises Teflon.

In some embodiments, the first and second air filters comprise ceramic filters.

In some embodiments, the first air filter is separable from the cover and the second air filter is separable from the body part.

In some embodiments, the cover comprises aluminum.

In some embodiments, the cover is subjected to the charge prevention processing.

In some embodiments, the wafer carrier further comprises: first and second filter covers positioned to cover the first and second air filters respectively and subjected to the charge prevention processing.

In some embodiments, the first filter cover includes: a first sub filter cover securing the first air filter to the cover, and a second sub filter cover preventing the first air filter from being mechanically damaged.

In some embodiments, the first sub filter cover is positioned at the outer perimeter of the first air filter and secured to the cover by a bolt.

In some embodiments, the second sub filter cover is positioned to cover the top of the first air filter and includes a plurality of holes.

In some embodiments, the first sub filter cover and the second sub filter cover are integrated.

In some embodiments, the first air filter and the cover are connected by a silicon O-ring.

In some embodiments, the wafer carrier further comprises a handle mounted at a side of the body part.

In another aspect, a wafer carrier comprises: a body part constructed and arranged to accommodate a wafer and having first and second air filters positioned at respective first and second side portions thereof that face each other; a cover mountable to the body part and having a third air filter positioned at a top portion thereof; and first to third filter covers positioned to cover the first to third air filters, respectively and including a plurality of holes, wherein gas that flows in the third air filter is discharged through the first and second air filters.

In another aspect, a wafer carrier comprises: a body portion; a removable cover portion that covers the body portion to enclose an inner region of the wafer carrier, the inner region dimensioned to carry a wafer therein and the body portion comprising sidewalls, the sidewalls comprising a first outer layer and a second inner layer, the second inner layer comprising a material different than that of the first outer layer, the second inner layer facing the inner region, wherein the second inner layer is treated with a charge prevention treatment; a first air filter on an opening in the cover portion; and a second air filter on an opening in the body portion.

In some embodiments, the first outer layer comprises polyether sulfone (PES) or aluminum (Al).

In some embodiments, the second inner layer comprises Teflon.

In some embodiments, the cover portion is treated with a charge prevention treatment.

In some embodiments, the first and second air filters comprise ceramic air filters.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF EMBODIMENTS

Figure 1:
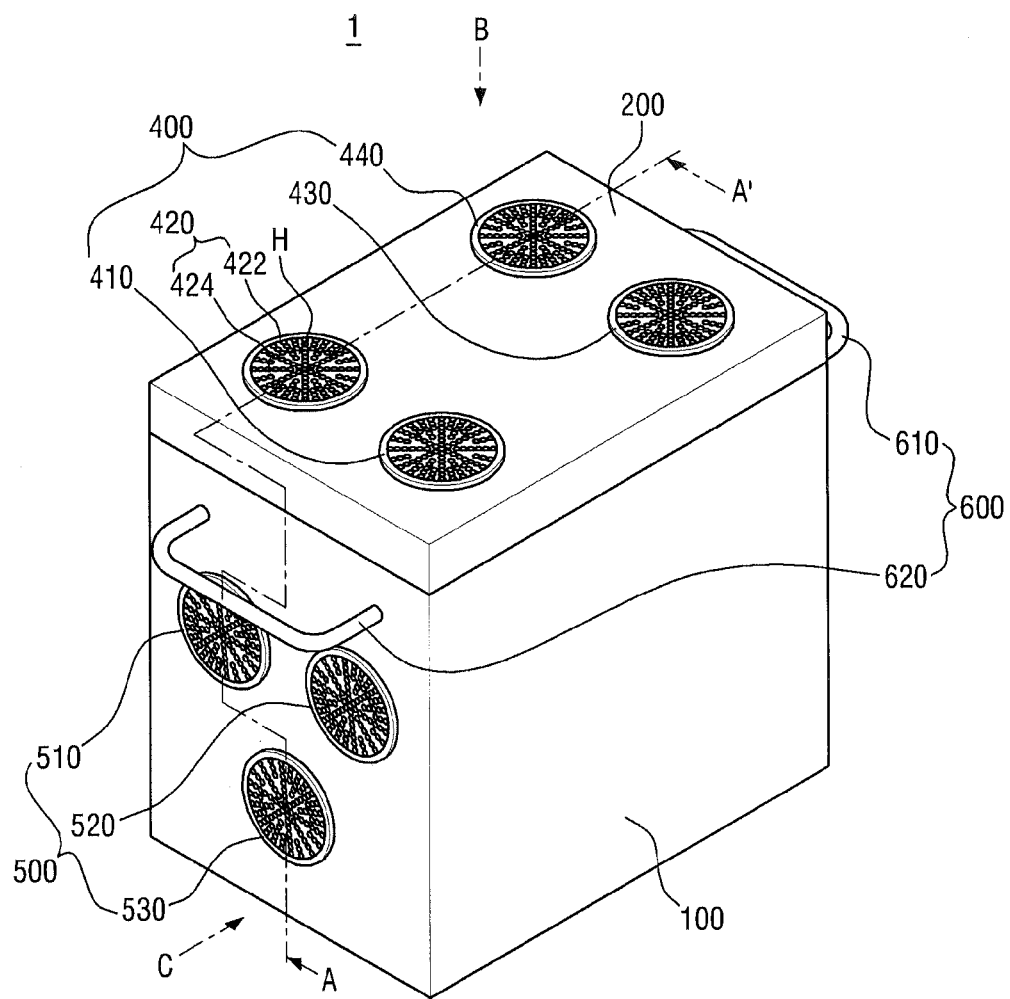
FIG. 1 is a perspective view for describing a wafer carrier according to an embodiment of the present inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a wafer carrier according to an embodiment of the present inventive concepts will be described with reference to FIGS. 1 to 3.

FIG. 1 is a perspective view for describing a wafer carrier according to an embodiment of the present inventive concepts. FIG. 2 is a perspective view illustrating a state in which a cover is removed in FIG. 1. FIG. 3 is an enlarged diagram of portion D of FIG. 2. FIG. 4 is a cross-sectional view taken along line A-A' of FIG. 1.

Figure 2:
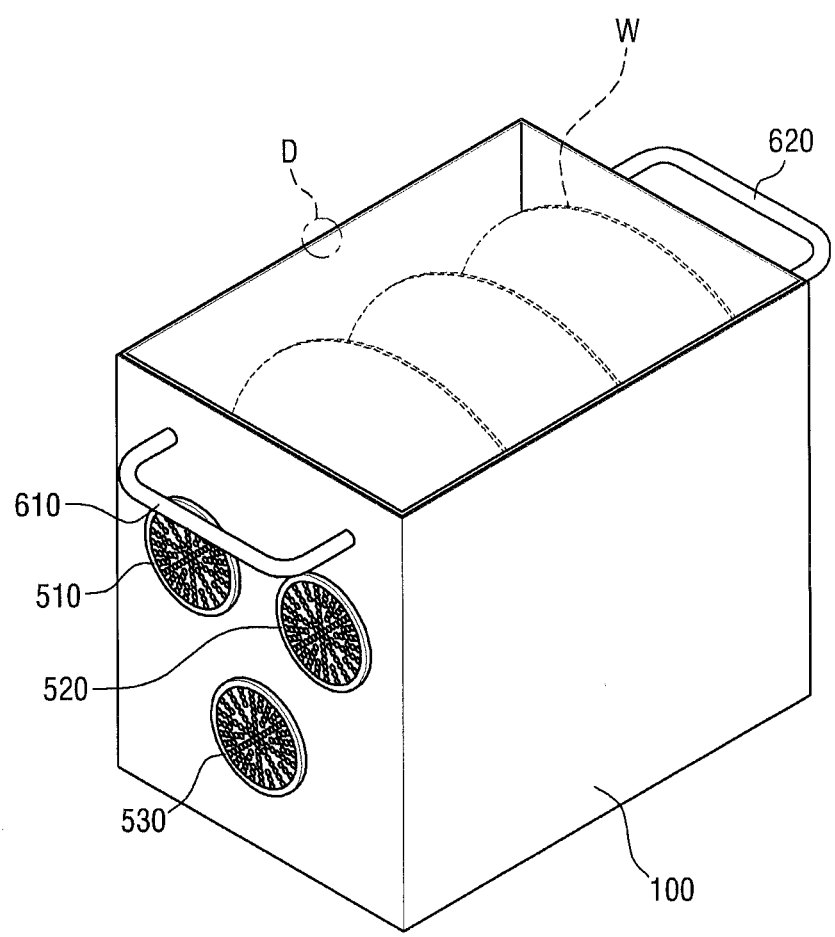
FIG. 2 is a perspective view illustrating a state in which a cover is removed in FIG. 1.

First, referring to FIGS. 1 and 2, the wafer carrier 1 according to the embodiment of the present inventive concepts may include a body part 100, a cover 200, first and second air filters AF1 and AF2 of FIG. 4, first and second filter covers 400 and 500, and a handle 600.

In detail, the body part 100 is a container dimensioned to accommodate a wafer W. In some embodiments, walls of the body part 100 include first and second layers 105 and 110 of FIG. 3 which are stacked or otherwise applied to each other. Further, in some embodiments, the body part 100 may be resistant to high temperature or high humidity and prevent contamination of the wafer W that may otherwise be caused due to the presence of particles.

Figure 3:
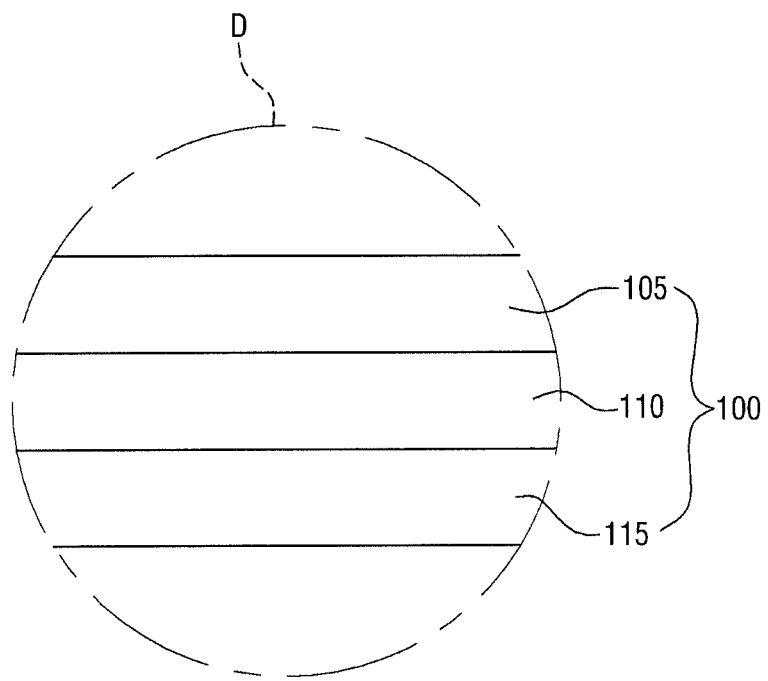
FIG. 3 is an enlarged diagram of portion D of FIG. 2.
Figure 4:
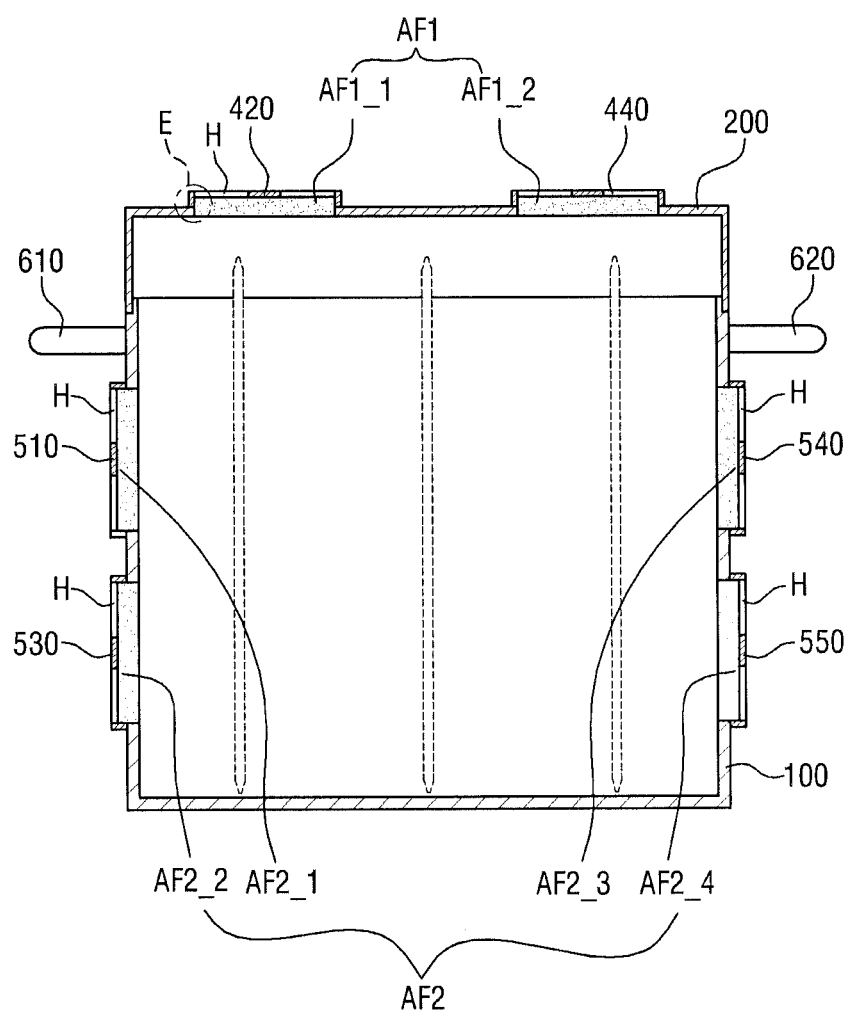
FIG. 4 is a cross-sectional view taken along line A-A' of FIG. 1.

Herein, referring to FIG. 3, a diagram in which a cross-section of the body part 100 is enlarged is illustrated.

In detail, in some embodiments, the body part 100 includes the first layer 105 and the second layer 110. Herein, the first layer 105 as an outermost layer of the body part 100 may include polyether sulfone (PES) or aluminum (AL). Further, the second layer 110 is a layer positioned between the outermost first layer 105 and the wafer W and the second layer 110 may include Teflon.

In some embodiments, charge prevention processing 115 may be performed on the body part 100 so as to prevent static electricity generation between the second layer 110 and the body part 100 and the wafer W. In the embodiment of FIG. 3, the charge prevention processing 115 is shown as being performed only between the second layer 110 and the wafer W, however the present inventive concepts are not limited thereto and the charge prevention processing may additionally or alternatively be performed on an outer surface of the first layer 105.

In some embodiments, the body part 100 may be formed by a machining process or a molding process. Further, when the body part 100 is formed by a machining process, in some embodiments, the first layer 105 may include aluminum, and, in some embodiments, when the body part 100 is formed by a molding process, the first layer 105 may include polyether sulfone.

Referring back to FIGS. 1 and 2, as well as FIG. 4, the handle 600 and the second air filter AF2 may be positioned on the side panels of the body part 100. In some embodiments, the handle 600 and the second air filter AF2 may be formed on both sides of the body part 100 respectively and a more detailed description of the handle 600 and the second air filter 500 will be made herein.

In some embodiments, the cover 200 may be mounted on the body part 100. In detail, the cover 200 may include aluminum and may be subjected to the charge prevention processing. In some embodiments, the charge prevention processing may optionally be performed on an inner surface or an outer surface of the cover 200, or, optionally at both the inner and outer surfaces of the cover 200.

In some embodiments, the first air filter AFI of FIG. 4 may be mounted on the top of the cover 200. The first air filter AF1 of FIG. 4 may be positioned on the cover in consideration of the position of the wafers W, as accommodated in the body part 100. A detailed description thereof will be made herein.

In some embodiments, the first air filter AF1 of FIG. 4 may comprise, for example, a ceramic filter and may operate to prevent contamination of the wafer W due to particles. In some embodiments, the first air filter AF1 of FIG. 4 is configured to allow a temperature stress or humidity stress to be applied to the internal region of the body part 100.

In some embodiments, application of a temperature stress may take the form of, for example, heating the wafer to a temperature which is equal to or higher than a predetermined reference temperature. In some examples, heating the wafer is accomplished by applying heated air to the inner region of the body part 100. In some embodiments, application of a humidity stress may take the form of, for example, applying a moisture having a predetermined reference or higher to the wafer. Further description of the first air filter AF1 of FIG. 4 will be provided herein.

In some embodiments, the second air filter AF2 of FIG. 4 may be mounted to a side of the body part 100.

In some embodiments, the second air filter AF2 of FIG. 4 may comprise, for example, a ceramic filter and may operate to prevent contamination of the wafer W due to particles. In some embodiments, the second air filter AF2 of FIG. 4 is configured to allow a temperature stress or humidity stress to be applied to the internal region of the body part 100. Further description of the second air filter AF2 of FIG. 4 will be provided herein.

The first filter cover 400 may be positioned to cover the first air filter AF1 of FIG. 4. In some embodiments, the first filter cover 400 may comprise, for example, aluminum and may be subjected to the charge prevention processing described herein.

Figure 5:
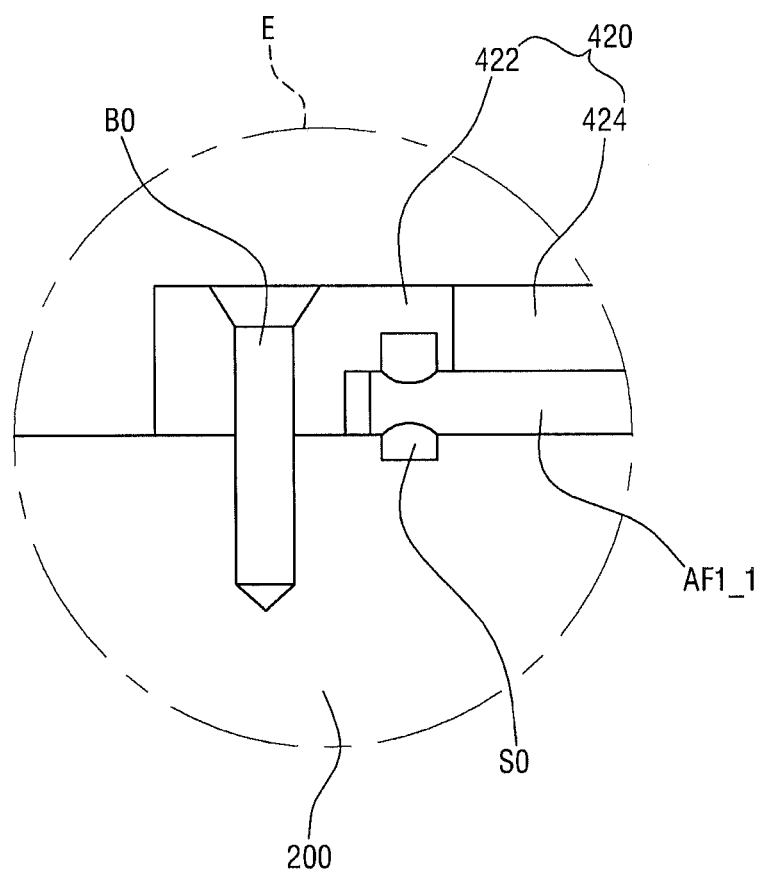
FIGS. 5 and 6 are enlarged diagrams of portion E of FIG. 4.

In some embodiments, referring to FIG. 5, the first filter cover (for example, 420) may include a first sub filter cover (for example, 422) that fixes the first air filter (for example, AF1_1 of FIG. 4) to the cover 200 and a second sub filter cover (for example, 424) that prevents the first air filter (for example, AF1_1 of FIG. 4) from being mechanically damaged.

In some embodiments, the first sub filter cover (for example, 422) is positioned at the outer circumference or outer perimeter of the first air filter (for example, AF1_1 of FIG. 4) and the second sub filter cover (for example, 424) includes a plurality of holes H.

In some embodiments, the second filter cover 500 may be positioned to cover the second air filter AF2 of FIG. 4. In some embodiments, the first filter cover 500 may include, for example, aluminum and may be subjected to the charge prevention processing described herein.

In some embodiments, the second filter cover 500 may be the same as the first filter cover 400 except that the second filter cover 500 is formed to cover the second air filter AF2 of FIG. 4. Therefore, a detailed description thereof will be omitted.

In some embodiments, the handle 600 may mounted at both sides of the body part 100 to be used for transportation. In detail, the handle 600 may be positioned at both sides of the body part 100 and positioned on the upper side of the second filter cover 500. However, the present inventive concepts are not limited thereto. That is, the handle 600 may be mounted, for example, at only one side of the body part 100, or the handle 600 may be positioned at the lower side of the second filter cover 500.

Hereinafter, the first and second filters AF1 and AF2 and the first and second filter covers 420, 440, 510, 530, 540, and 55 will be described in more detail with reference to FIGS. 4 through 8.

Figure 6:
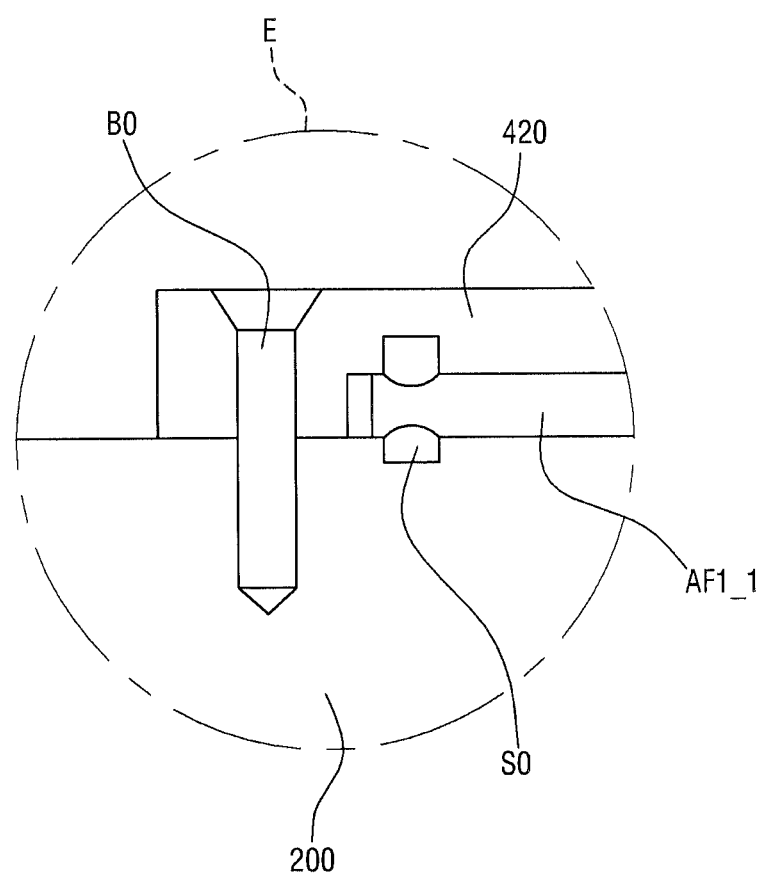
Figure 7:
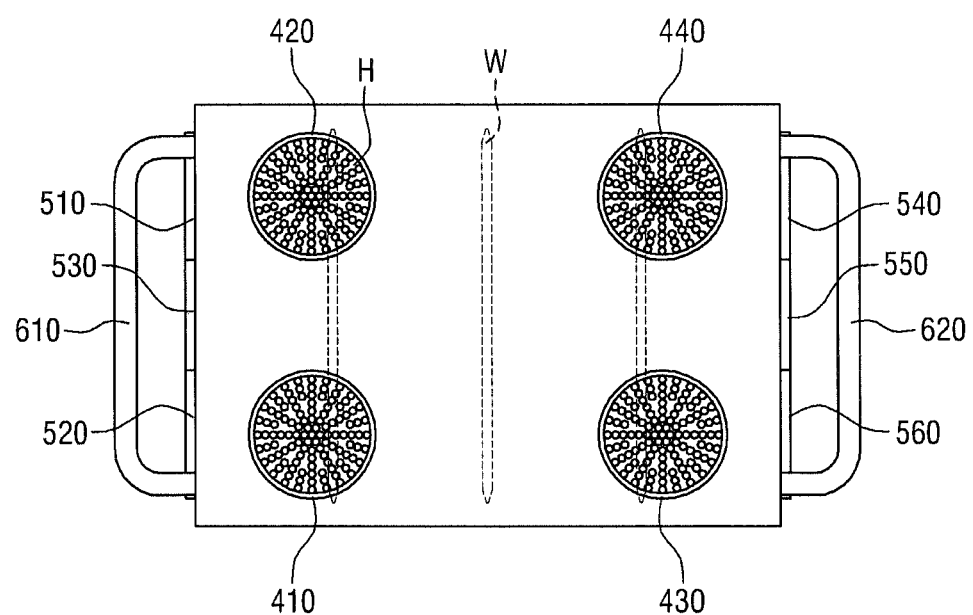
FIG. 7 is a plan view of FIG. 1 viewed in a B direction.
Figure 8:
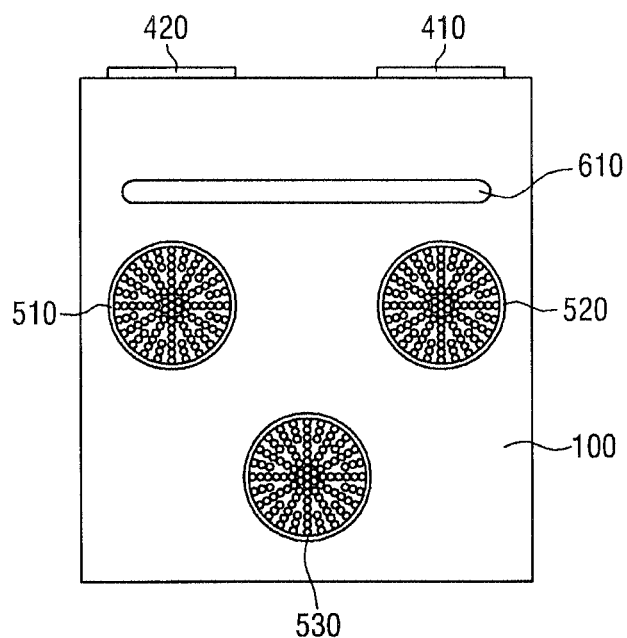
FIG. 8 is a plan view of FIG. 1 viewed in a C direction.

FIG. 4 is a cross-sectional view taken along line A-A' of FIG. 1. FIGS. 5 and 6 are enlarged diagrams of portion E of FIG. 4. FIG. 7 is a plan view of FIG. 1 viewed in the B direction. FIG. 8 is a plan view of FIG. 1 viewed in the C direction.

Referring to FIG. 4, in some embodiments, the first air filter AF1 may be mounted at the top of the cover 200 and the first filter covers 420 and 440 may be formed to cover the first air filter AF1. In some embodiments, the first air filter AF1 may be separable from the cover 200.

The first air filter AF1 may be plural in number, and the plurality of first air filters AF1_1 and AF1_2 may be arranged to be lined up at sides of the wafer W based on the position wafer W accommodated in the body part 100. In some embodiments, the layout of the first air filters AF1_1 and AF1_2 allows the temperature or the humidity to be smoothly or uniformly transferred to the wafer W inside the wafer carrier 1 when the wafer-level reliability evaluation is performed.

Referring to FIG. 7, the first air filters (not illustrated) are respectively disposed below the first filter covers 410, 420, 430, and 440, and as a result, the layout of the first air filters described above may be determined In various embodiments, the first air filters may be arranged in various layout configurations, in addition to the layout shown in which the first air filters are arranged to be lined up at both sides of the wafer W.

Additionally, in the present embodiment, four first air filters (that is, disposed below the first filter covers 410, 420, 430, and 440, respectively) are disposed on the cover 200, but the present inventive concepts are not limited thereto and four first air filters or more or less may be mounted.

Referring back to FIG. 4, the second air filter AF2 may be mounted on both sides of the body part 100 and the second filter covers 501, 530, 540, and 550 may be formed to cover the second air filter AF2. Further, the second air filter AF2 may be separated from the cover 100.

The second air filter AF2 may be plural in number, and, in some embodiments, the plurality of second air filters AF2_1, AF2_2, AF2_3, and AF2_4 may be mounted at both sides of the body part 100 to face each other. A layout of the second air filters AF2_1, AF2_2, AF2_3, and AF2_4 allows the temperature or the humidity to be smoothly or uniformly transferred to the wafer W within the wafer carrier 1 when the wafer level reliability evaluation is performed.

Referring to FIG. 8, the second air filters (not illustrated) are disposed below the second filter covers 510, 520, and 530, respectively, and as a result, the layout of the second air filters described above may be determined. In various embodiments, the second air filters may be arranged in various layout configurations in addition to the layout structure in which the second air filters are mounted at both sides of the body part 100 to face each other.

Additionally, in the present embodiment, each of three second air filters (that is, disposed below the second filter covers 510, 520, and 530, respectively) is disposed at both sides of the body part; however, the present inventive concepts are not limited thereto and three or more second air filters or three or less second air filters may be mounted.

In addition, in the present embodiment, each of the second air filters (that is, disposed below the second filter covers 510, 520, and 530, respectively) is mounted at the lower side of the handle 610 mounted at both sides of the body part 100, however, the present inventive concepts are not limited thereto. For example, in other embodiments, the second air filter may be mounted to surround the handle 610 or, in other embodiments, the second air filter may be mounted on the upper side of the handle 610.

Referring back to FIG. 4, the first filter covers 420 and 440 may be positioned to cover the first air filters AF1_1 and AF1_2 and include the first and second sub filter covers 422 and 424 of FIG. 5.

In detail, referring to FIG. 5, the first sub filter cover 422 may be positioned on the outer periphery of the first air filter AF1_1 and fixed to the cover 200 by a bolt BO. In some embodiments, the bolt BO may comprise a plastic bolt which is resistant to the high temperature; however, the present inventive concepts are not limited thereto.

In some embodiments, the second sub filter cover 424 may be formed to cover the top of the first air filter AF1_1 and include the plurality of holes H of FIG. 1.

Meanwhile, referring to the embodiment of FIG. 6, in some embodiments, the first filter cover 420 may be integrated unlike FIG. 5. That is, unlike FIG. 5, the first filter cover 420 may not be separated into the first and second sub filter covers and may be formed as an integral unit.

Additionally, in some embodiments, the first air filter AF1_1 and the cover 200 may be connected by a silicon O-ring (SO). Although not illustrated in FIG. 6, the second air filter AF2 may be connected with the body part 100 by the silicon O-ring and the cover 200 may be connected with the body part 100 by the silicon O-ring.

Referring back to FIG. 4, in some embodiments, the second filter covers 510, 530, 540, and 550 may be formed to cover the second air filter AF2. In some embodiments, the second filter covers 510, 530, 540, and 550 have a structure that is similar to that of the first filter covers 420 and 440. Therefore, a detailed description thereof will be omitted.

Hereinafter, a ventilation structure of the wafer carrier 1 of FIG. 1 will be described with reference to FIGS. 9 to 11.

Figure 9:
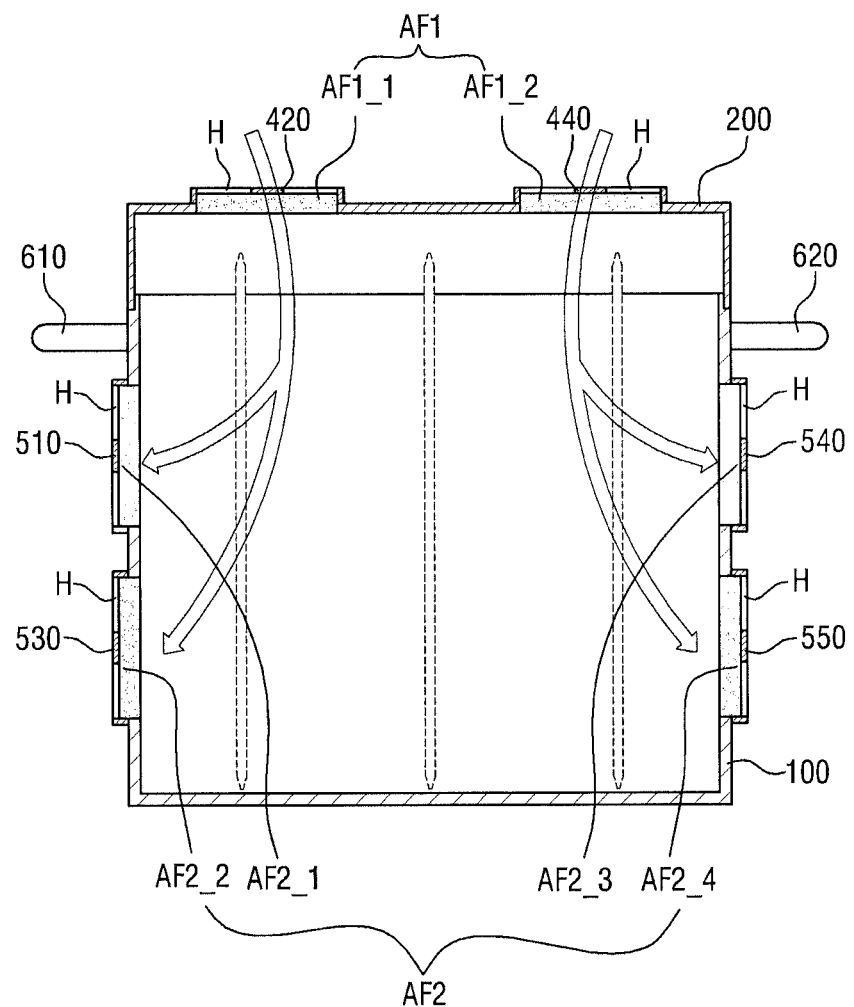
FIGS. 9, 10 and 11 are schematic views for describing a ventilation structure of the wafer carrier of FIG. 1.
Figure 10:
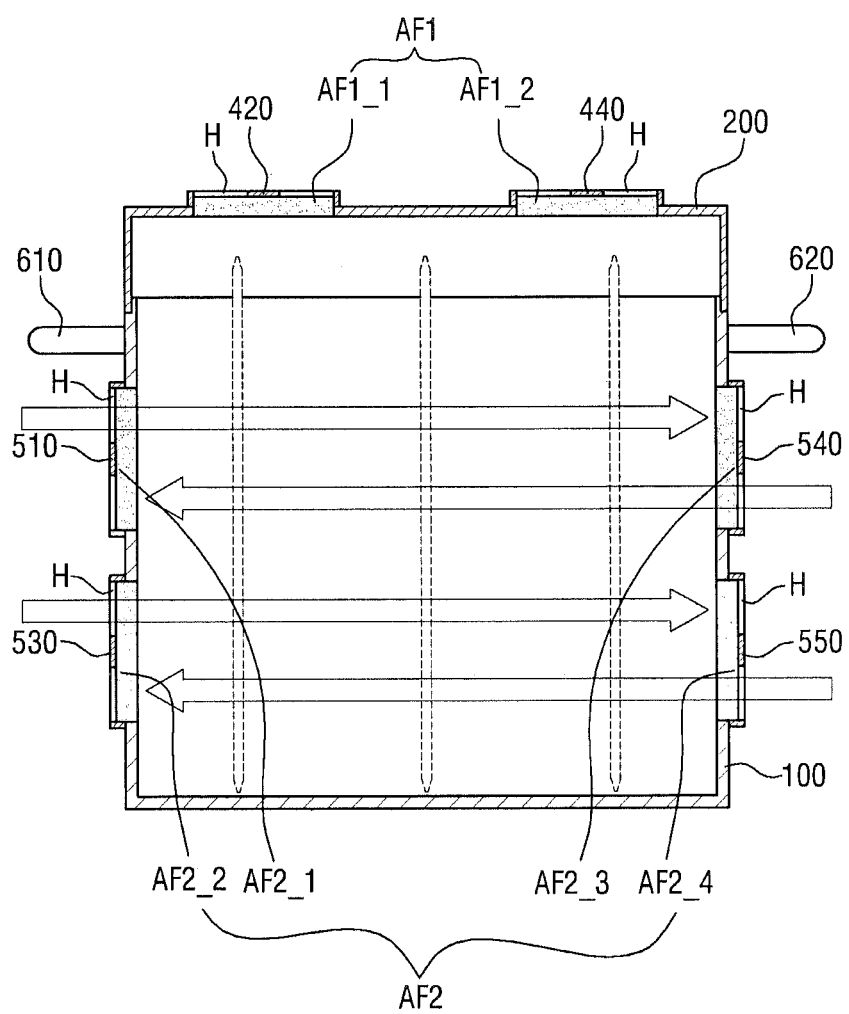
Figure 11:
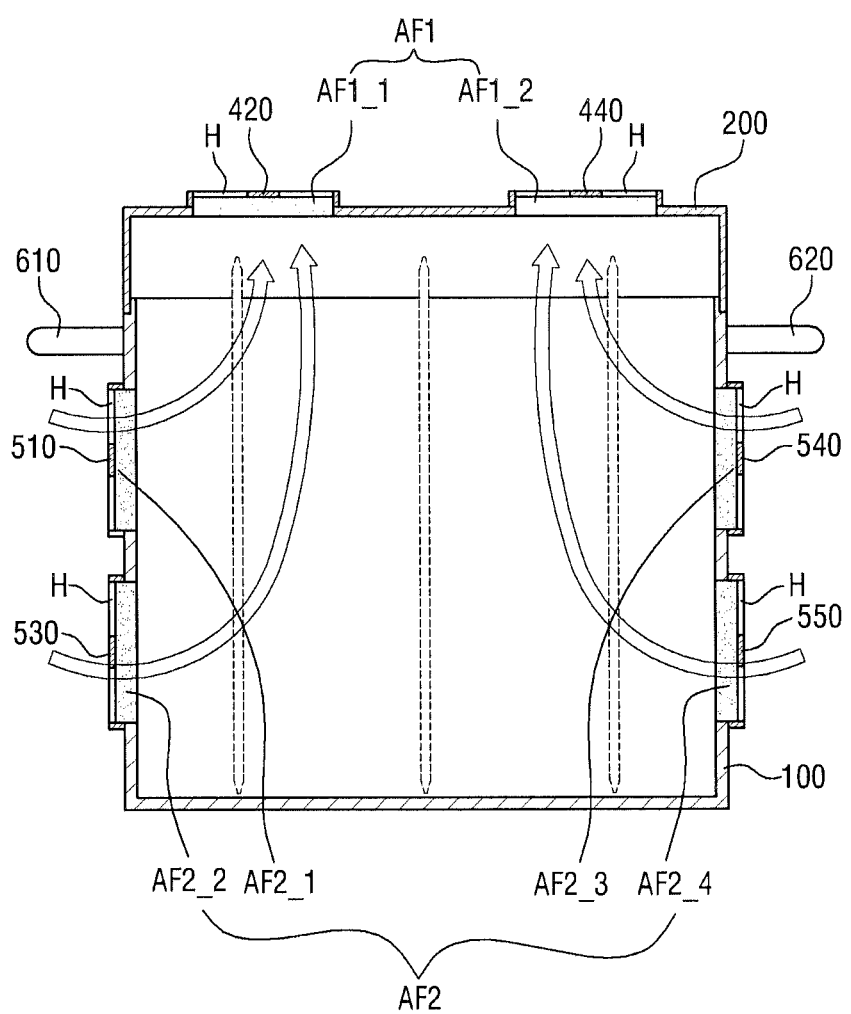

FIGS. 9 to 11 are schematic views for describing a ventilation structure of the wafer carrier of FIG. 1.

Referring to FIG. 9, in the present embodiment, the temperature/humidity stress procedure is applied to the interior region of the wafer carrier 1 through the first air filter AF1. The temperature/humidity stress applied through the first air filter AF1 mounted on the cover 200 may be discharged to the outside through the second air filter AF2 mounted on both sides of the body part 100 through the wafer W.

Next, referring to FIG. 10, in the present embodiment, the temperature/humidity stress is applied to the interior of the wafer carrier 1 through the second air filter AF2. The temperature/humidity stress applied through the second air filter AF2 mounted on both sides of the body part 100 to face each other may be discharged to external regions through the second air filter AF2 mounted on the opposite side of the body part 100 through the wafer W.

Last, referring to FIG. 11, in the present embodiment, the temperature/humidity stress other than the particles is applied to the inside of the wafer carrier 1 through the second air filter AF2. The temperature/humidity stress applied through the second air filter AF2 mounted on both sides of the body part 100 to face each other may be discharged to external regions through the first air filter AF1 mounted on the top of the cover 200 through the wafer W.

The wafer carrier 1 according to embodiments of the present inventive concepts includes the body part 100 including the first layer 105 including aluminum or the polyether sulfone and the second layer 110 including the Teflon to be resistant to the high temperature or humidity and prevent the contamination of the wafer W due to particles. The wafer carrier 1 includes the first and second air filters AF1 and AF2 in the form of a ceramic filter to prevent the contamination of the wafer W due to the particles and apply temperature or humidity stress environments to the interior regions of the body part 100. As a result, although the reliability (environment) test is performed in the wafer level prior to encapsulation at the package level, the wafer carrier 1 may operate to mitigate or prevent contamination of the wafer due to the particles and may therefore be subjected to a characterization evaluation as part of the fabrication process. Further, reliability testing may optionally be performed at the wafer level prior to further processing of the components to the package level, which can be more cost-effective.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific embodiments disclosed, and that modifications to the disclosed embodiments, as well as other embodiments, are intended to be included within the scope of the appended claims. The present inventive concepts are defined by the following claims, with equivalents of the claims to be included therein.

What is claimed is:

1. A wafer carrier comprising:
   a body part constructed and arranged to accommodate a wafer and including a first layer and a second layer which are stacked in sequence;
   a cover mountable to the body part;
   a first air filter positioned on the cover;
   a second air filter positioned on a side of the body part; and
   first and second filter covers positioned to cover the first and second air filters respectively and the filter covers subjected to charge prevention processing,
   wherein the second layer is positioned between the first layer and an inner region of the body part and wherein a surface of the second layer facing the inner region is subjected to charge prevention processing.

2. The wafer carrier of claim 1, wherein the first layer comprises polyether sulfone (PES) or aluminum (Al).

3. The wafer carrier of claim 2, wherein the second layer comprises Teflon.

4. The wafer carrier of claim 1, wherein the first and second air filters comprise ceramic filters.

5. The wafer carrier of claim 1, wherein the first air filter is separable from the cover and the second air filter is separable from the body part.

6. The wafer carrier of claim 1, wherein the cover comprises aluminum.

7. The wafer carrier of claim 1, wherein the cover is subjected to charge prevention processing.

8. The wafer carrier of claim 1, wherein the first filter cover includes:
   a first sub filter cover securing the first air filter to the cover, and
   a second sub filter cover preventing the first air filter from being mechanically damaged.

9. The wafer carrier of claim 8, wherein the first sub filter cover is positioned at the outer perimeter of the first air filter and secured to the cover by a bolt.

10. The wafer carrier of claim 8, wherein the second sub filter cover is positioned to cover the top of the first air filter and includes a plurality of holes.

11. The wafer carrier of claim 8, wherein the first sub filter cover and the second sub filter cover are integrated.

12. The wafer carrier of claim 1, wherein the first air filter and the cover are connected by a silicon O-ring.

13. The wafer carrier of claim 1, further comprising a handle mounted at a side of the body part.

14. A wafer carrier comprising:
   a body part constructed and arranged to accommodate a wafer and having first and second air filters positioned at respective first and second side portions thereof that face each other;
   a cover mountable to the body part and having a third air filter positioned at a top portion thereof; and
   first to third filter covers positioned to cover the first to third air filters, respectively and including a plurality of holes, the first to third filter covers positioned to cover the first to third air filters, respectively, and the filter covers subjected to charge prevention processing,
   wherein gas that flows in the third air filter is discharged through the first and second air filters.

15. A wafer carrier, comprising:
   a body portion;
   a removable cover portion that covers the body portion to enclose an inner region of the wafer carrier, the inner region dimensioned to carry a wafer therein; and
   the body portion comprising sidewalls, the sidewalls comprising a first outer layer and a second inner layer, the second inner layer comprising a material different than that of the first outer layer, the second inner layer facing the inner region, wherein the second inner layer is treated with a charge prevention treatment;
   a first air filter on an opening in the cover portion;
   a second air filter on an opening in the body portion; and
   first and second filter covers positioned to cover the first and second air filters respectively and the filter covers subjected to charge prevention processing.

16. The wafer carrier of claim 15 wherein the first outer layer comprises polyether sulfone (PES) or aluminum (Al).

17. The wafer carrier of claim 15 wherein the second inner layer comprises Teflon.

18. The wafer carrier of claim 15 wherein the cover portion is treated with a charge prevention treatment.

19. The wafer carrier of claim 15 wherein the first and second air filters comprise ceramic air filters.

\* \* \* \* \*